US011563153B2

(12) United States Patent
Loke et al.

(10) Patent No.: US 11,563,153 B2
(45) Date of Patent: Jan. 24, 2023

(54) OPTOELECTRONIC DEVICE HAVING A COVER INCLUDING CHANNEL

(71) Applicant: OSRAM Opto Semiconductors GmbH, Regensburg (DE)

(72) Inventors: Chai Liang Loke, Gelugor (MY); Purusothaman Supramaniam, Gelugor (MY); Vengadasalam Yogenthra, Hutan Melintang (MY); Luruthudass Annaniah, Teluk Kumbar (MY)

(73) Assignee: OSRAM Opto Semiconductors GmbH, Regensburg (DE)

( * ) Notice: Subject to any disclaimer, the term of this patent is extended or adjusted under 35 U.S.C. 154(b) by 116 days.

(21) Appl. No.: 17/055,309

(22) PCT Filed: May 14, 2018

(86) PCT No.: PCT/EP2018/062415
§ 371 (c)(1),
(2) Date: Nov. 13, 2020

(87) PCT Pub. No.: WO2019/219166
PCT Pub. Date: Nov. 21, 2019

(65) Prior Publication Data
US 2021/0226098 A1 Jul. 22, 2021

(51) Int. Cl.
*H01L 33/48* (2010.01)
*H01L 33/58* (2010.01)
(52) U.S. Cl.
CPC ............ *H01L 33/486* (2013.01); *H01L 33/58* (2013.01); *H01L 2933/0058* (2013.01)
(58) Field of Classification Search
CPC .. H01L 33/486; H01L 33/58; H01L 2933/005
See application file for complete search history.

(56) References Cited

U.S. PATENT DOCUMENTS

| | | | |
|---|---|---|---|
| 2007/0152229 A1* | 7/2007 | Yoshida | H01L 33/486 257/E33.073 |
| 2010/0047935 A1* | 2/2010 | Chen | H01L 33/52 438/26 |
| 2011/0062473 A1 | 3/2011 | Tanuma et al. | |

FOREIGN PATENT DOCUMENTS

| | | |
|---|---|---|
| EP | 1467417 A2 | 10/2004 |
| JP | 2012038999 A | 2/2012 |

(Continued)

OTHER PUBLICATIONS

International Search Report and Written OpinionNPL1_ in corresponding International Application No. PCT/EP2018/062415 dated Jan. 18, 2019, 9 pages.

*Primary Examiner* — Jay C Chang
*Assistant Examiner* — Mikka Liu
(74) *Attorney, Agent, or Firm* — MH2 Technology Law Group LLP

(57) ABSTRACT

An optoelectronic device includes a substrate, an optoelectronic semiconductor component being arranged on the substrate and having a light-emitting surface, preferably on the upper side of the optoelectronic semiconductor component, and a cover being arranged on the substrate for covering the optoelectronic semiconductor component, the cover providing a cavity which surrounds the optoelectronic semiconductor component when the cover is arranged on the substrate, the cover having at least one channel which extends along a first direction in the cover from the outside to the cavity, and the first direction being not parallel to the substrate and preferably extending at least approximately perpendicular to the substrate.

14 Claims, 4 Drawing Sheets

(56) References Cited

FOREIGN PATENT DOCUMENTS

Figure 1:
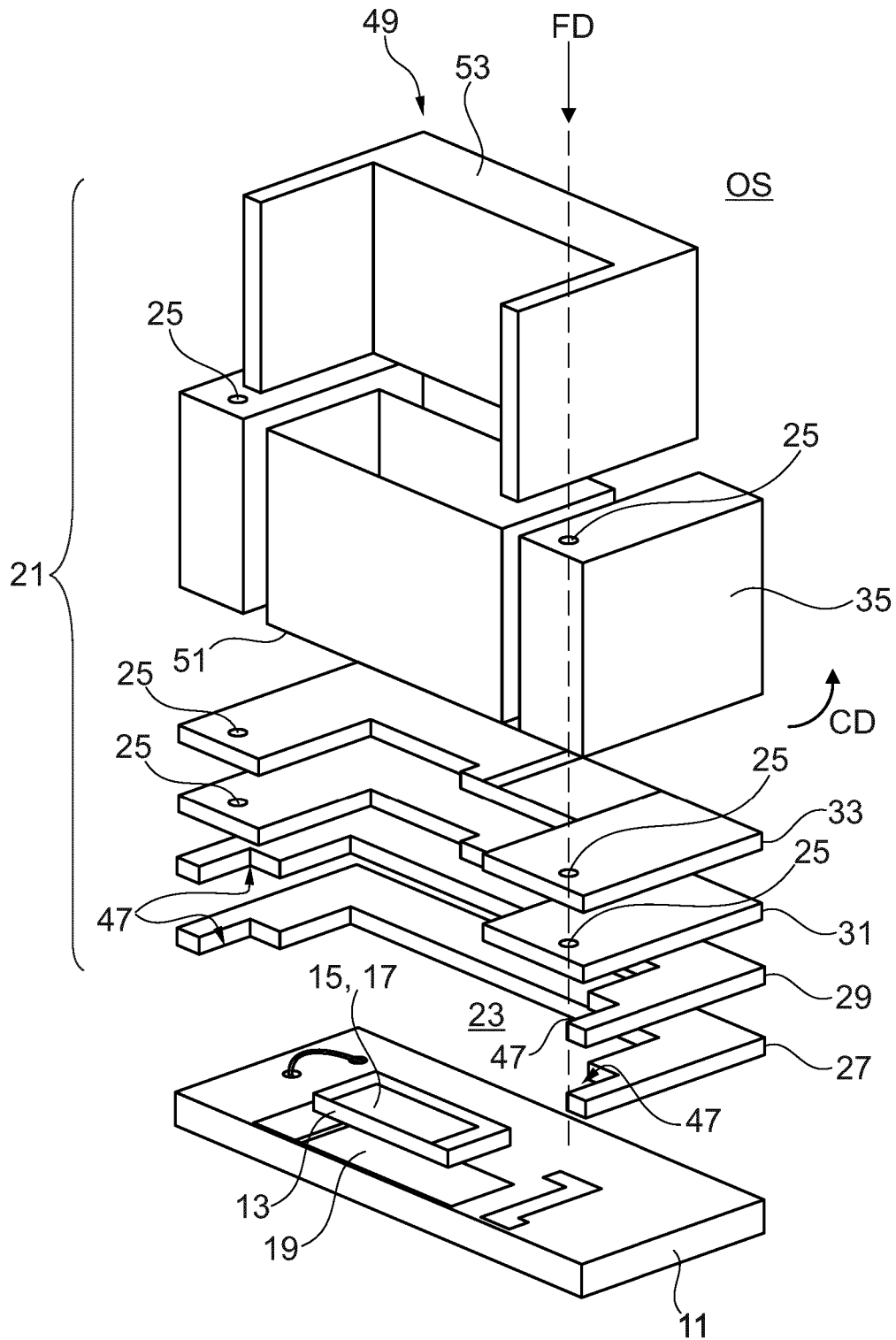

| JP | 2012044209 A | 3/2012 |
|---|---|---|
| WO | 2008003167 A1 | 1/2008 |

\* cited by examiner

OPTOELECTRONIC DEVICE HAVING A COVER INCLUDING CHANNEL

CROSS-REFERENCE TO RELATED APPLICATIONS

This patent application is a national stage entry from International Application No. PCT/EP2018/062415, filed on May 14, 2018, published as International Publication No. WO 2019/219166 A1 on Nov. 21, 2019, the entire contents of which is incorporated by reference herein.

The present invention relates to an optoelectronic device and a method for fabricating an optoelectronic device.

An optoelectronic device can have a substrate and an optoelectronic semiconductor component, for example a semiconductor laser or a LED (=light emitting diode) arranged on the substrate. The optoelectronic semiconductor component can have a light-emitting surface on the upper side of the optoelectronic semiconductor component. Furthermore, the device can have a cover, which is arranged on the substrate for covering the optoelectronic semiconductor component. The cover can be designed such that it has a cavity, which surrounds the optoelectronic semiconductor component when the cover is placed on the substrate.

In operation, the optoelectronic semiconductor component may heat up. This may warm up the air in the cavity. In order to avoid or reduce an increase of pressure in the cavity caused by the heated air, the air must be able to expand without causing a substantial pressure increase.

The present invention therefore seeks to provide an improved optoelectronic device, which enables the air in the cavity to expand without causing a substantial pressure increase.

The above problem is solved by an optoelectronic device in accordance with the features of claim 1. Preferred embodiments of the present invention are disclosed in the dependent claims.

An optoelectronic device according to the present invention comprises a substrate, an optoelectronic semiconductor component being arranged on the substrate and having a light-emitting surface, preferably on the upper side of the optoelectronic semiconductor component, and a cover being arranged on the substrate for covering the optoelectronic semiconductor component, the cover providing a cavity which surrounds the optoelectronic semiconductor component when the cover is arranged on the substrate, the cover having at least one channel which extends along a first direction in the cover from the outside to the cavity, and the first direction being not parallel to the substrate and preferably extending at least approximately perpendicular to the substrate.

The at least one channel extends therefore in the first direction which is not parallel to the substrate and in particular not parallel to the top surface of the substrate. The first direction could for example be oriented at a predefined angle with respect to the top surface of the substrate. The angle may be in the range between 25° and 90°, for example at 30° or 45°. Preferably, the first direction of the at least one channel extends approximately perpendicular to the substrate. Thus, the angle between the first direction and the top surface may be at least approximately 90°.

The cover may in particular be arranged on the substrate such that a bottom side of the cover abuts the substrate or more precisely a top surface of the substrate. The top surface is usually flat and the first direction preferably runs at least approximately perpendicular to this flat surface. In addition, the upper side of the optoelectronic semiconductor component is normally flat and thus parallel to the top surface of the substrate. Thus, the first direction is preferably also at least approximately perpendicular to the upper side of the optoelectronic semiconductor component. In this case, the first direction may be regarded as a height direction using the top surface of the substrate as a reference plane.

The channel runs preferably rectilinear through the cover. Thus, the channel does preferably not have any bends or turns. This facilitates the manufacturing process of the channel, which can for example be manufactured by a drilling process. Other manufacturing processes, such as punching or blanking, may also be employed.

In the optoelectronic device, air which heats up in the cavity during the operation of the optoelectronic device can leave the cavity and flow through the channel to the outside. A pressure increase in the cavity can thus be avoided as the channel acts like a venting hole through which air can escape from the cavity to the outside.

The manufacturing process of the optoelectronic device may include that the substrate is cut through, in particular by use of a sawing process, to separate the optoelectronic device from other devices that were also produced on the same substrate. In an optoelectronic device, a venting hole may be foreseen at the bottom side of the cover in a direction which is substantially parallel to the substrate. The bottom side of the cover is the side, which abuts the substrate. The mouth of this venting hole is adjacent to the substrate. During the process of cutting or sawing through the substrate, debris may enter and possibly clog up the venting hole. Water or another fluid which may be used in particular for cooling purposes may also enter the venting hole which is undesired.

In the optoelectronic device in accordance with the present invention, as the channel runs through the cover in the first direction which is at least approximately vertical to the substrate, the channel may have an exit to the outside which is remote from the substrate. In particular, the channel may exit to the outside at the top side of the cover, which is remote from the substrate. During the process of cutting or sawing through the substrate, it can therefore be avoided that debris or fluid enters and possibly clogs up the channel.

The channel may exit into the cavity at a location which is remote from the substrate. The mouth of the channel into the cavity may therefore be located in the cover at a distance above the top surface of the substrate. This helps to avoid a clogging in the mouth region of the channel into the cavity.

Preferably, the channel exits into a recess in the inner surface of the cover which communicates with the cavity. The channel can thereby run rectilinear through the cover without having any bends or turns. Thus, the channel can be easily manufactured, for example by drilling, punching or blanking or any other suitable method.

The cover preferably comprises at least one sidewall, which surrounds in a circumferential direction the cavity, the circumferential direction being at least approximately parallel to the substrate. Thus, the circumferential direction is at least approximately perpendicular to the first direction. The at least one sidewall therefore encircles or encloses the cavity. The sidewall may have a height extending in the height direction and thus, at least approximately, in the first direction.

The bottom end of the at least one sidewall may form the bottom side of the cover and may abut the substrate. The at least one sidewall may encircle an opening at the bottom side through which the optoelectronic semiconductor component may protrude into the cavity when the cover is placed on the substrate.

The top end of the at least one sidewall may form the topside of the cover. The at least one sidewall may encircle an opening of the cavity at the topside of the cover. The at least one sidewall may be adapted to receive an insert in the opening, in particular to close the cavity at the topside of the cover.

The insert may comprise at least one optical element, in particular a lens or a window, through which light emitted by the optoelectronic semiconductor component leaves the device.

The insert may comprise a holder for the optical element. The holder may be made from a hardened liquid material which is poured into the cavity such that it surrounds the optical element which has been received by the cavity before the pouring process.

The insert may for example comprise a lens, in particular a meta-lens, and a holder for the lens, such as a meta-lens potting. The meta-lens may be made of a composite material which may be at least partially transparent and arranged to provide a lens effect for light travelling, in particular along the first direction, from the optoelectronic semiconductor component to the outside and through the lens. The meta-lens potting may be made of a silicon-based adhesive which may for example be poured around the lens in liquid form and hardened, for example via a curing process.

The cover preferably comprises four sidewalls arranged in a quadratic or rectangular form. The four sidewalls may therefore form a frame-like structure surrounding a cavity with the cavity being open at the top and the bottom. The cavity may be closed at the bottom by the substrate when the frame-like structure is placed on the substrate and on the top for example by the insert or another top cover. The four sidewalls are arranged such that with their ends abutting sidewalls enclose an angle of at least approximately 90 degrees. The sidewalls are preferably made in one-piece.

The channel preferably extends in a sidewall and in particular in a corner between two abutting sidewalls. The channel can therefore be easily fabricated. The insert, for example, is not required to be provided with a channel.

The channel may extend from a top end of the sidewall towards a bottom end of the sidewall where the channel opens into a recess arranged in the inner surface of the sidewall. The recess may communicate with the cavity. The air from the cavity can therefore flow via the recess into the channel and leave to the outside.

The cover comprises a layered structure consisting of multiple parallel layers of a material, in particular ceramic. The layered structure may in particular form the at least one side wall of the cover and further preferably the four sidewalls that form a frame-like structure surrounding the cavity. Thus, each layer may comprise or consist of a frame-like form surrounding a central recess. The layered structure may be sintered.

The channel runs through at least some of the layers of the multiple layers. The first direction along which the channel runs may not be parallel to the layers, and preferably the first direction is at least approximately perpendicular to the layers. The channel can be easily formed by drilling a hole through the layers.

Before the sintering process, a hole may be arranged individually, for example by drilling, punching or blanking or any other suitable process, in each layer through which the channel is supposed to run and in such a way that, when the layers are arranged on top of each other, the holes form the channel.

The layered structure may comprise at least one layer, in particular the bottom layer or layers of the layered structure which is or are closest to the substrate, through which the channel does not pass. This layer may be used to create a recess which is in communication with the cavity and the channel.

The optoelectronic semiconductor component is preferably a semiconductor laser, such as a VCSEL (Vertical Cavity Surface Emitting Laser), or a LED (light emitting diode).

The invention also relates to a method for fabricating an optoelectronic device, in particular an optoelectronic device in accordance with the present invention, the method comprises providing a plurality of layers of a material, such as a ceramic, each layer having a frame-like structure with a frame, in particular a rectangular or quadratic frame, enclosing a recess such that, when the layers are stapled on top of each other to form the layered structure, the recesses form a cavity which is open at the topside and the bottom side of the layered structure and the layers' frames form sidewalls enclosing the cavity, and the method further comprises fabricating, in particular by drilling, punching, blanking or the like, a hole in at least some of the layers such that the holes form a rectilinear channel when the layers are stapled on top of each other.

The holes may be fabricated such that they run through the layers in the first direction, which—at least approximately—is perpendicular to the layers or at a predefined angle with respect to the layers. Perpendicular to the layers means in particular that the first direction is perpendicular to the top or bottom side of the layers. In particular, the predefined angle, e.g. 30° or 45°, relates to the angle between the first direction and the top or bottom side of the layers.

The holes may in particular be fabricated before the layers are stapled on top of each other.

Preferably, in at least one layer, preferably the layer or layers which is or are at the bottom of the layered structure, no hole is fabricated but a recess such that the recess will be in communication with the cavity and the channel when the layers are stapled on top of each other to form the layered structure.

The method may further comprise the step of arranging the layers to form the layered structure on a substrate with an optoelectronic semiconductor component being arranged on the substrate such that the optoelectronic semiconductor component extends through the opening at the bottom side of the layered structure into the cavity, and the step of placing an insert with at least one optical component into the opening at the top side of the layered structure.

Preferably, the method further comprises the step of carrying out a sintering and/or curing process after the placing of the insert into the opening at the top side of the layered structure. The insert may preferably be a liquid material that is being poured into the cavity in which an optical element has already been placed. The liquid is cured and thereby hardened.

The method may further comprise the step of carrying out a manufacturing process, in particular a sawing process, on the substrate, with the device being arranged such that the mouth of the channel to the outside is facing downwards.

In the following description of examples, reference is made to the accompanying drawings in which by way of illustration specific examples are shown that can be practiced. It is to be understood that other examples can be used and structural changes can be made.

Figure 2:
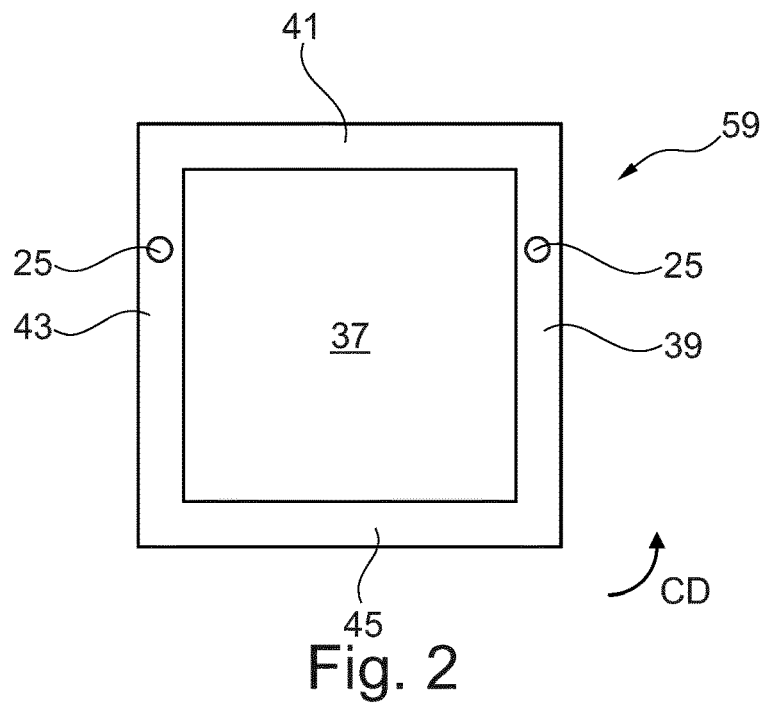

FIG. 1 shows schematically an exploded cutaway view of a first example of an optoelectronic device in accordance with the present invention, FIG. 2 shows schematically a plan view of a layer of the device of FIG. 1.

Figure 3:
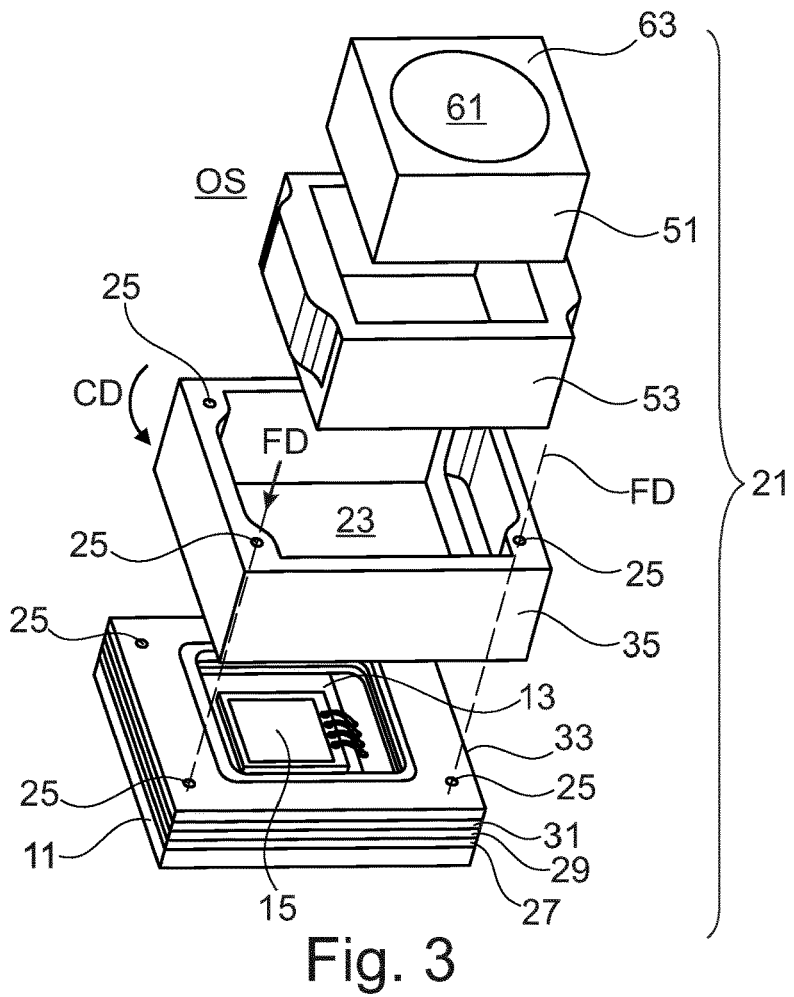
Figure 4:
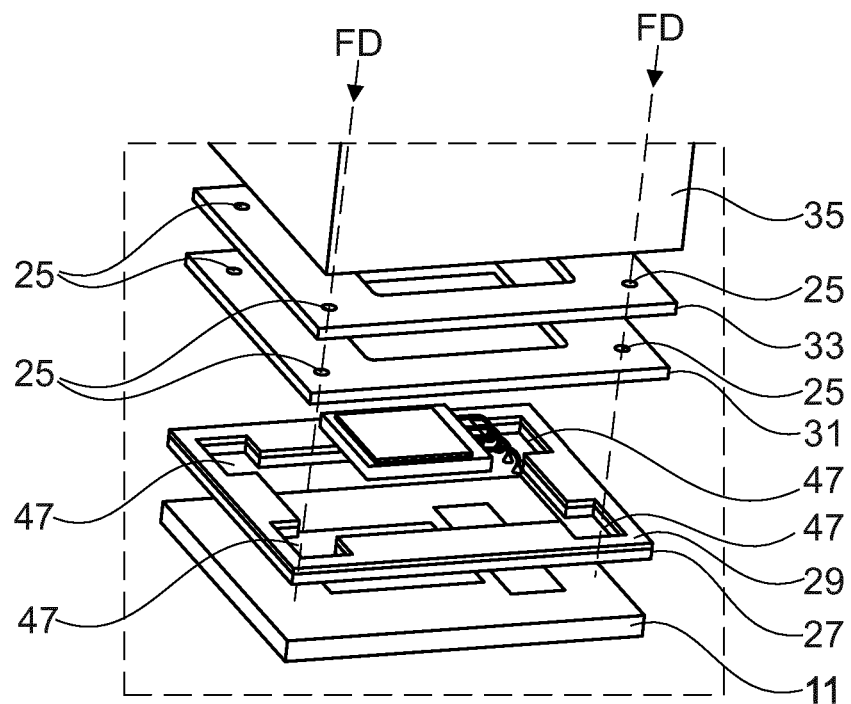
Figure 5:
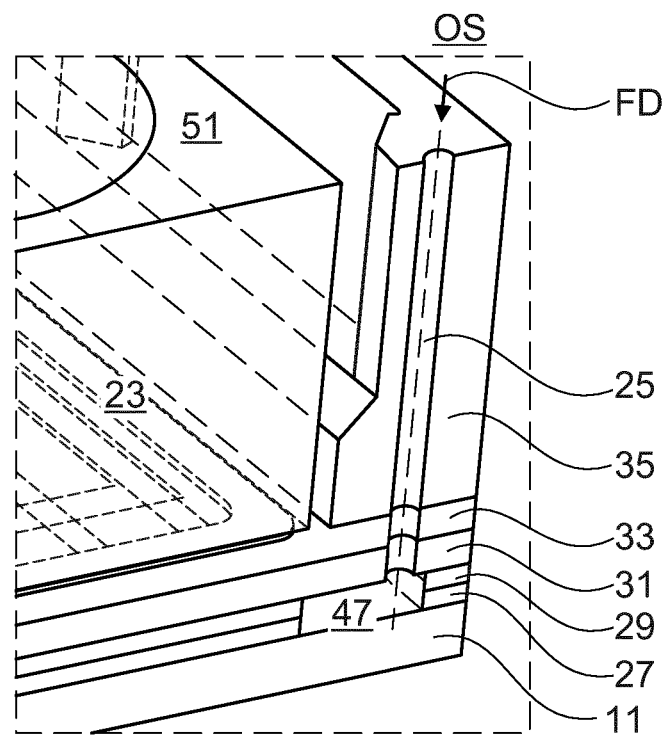
Figure 6:
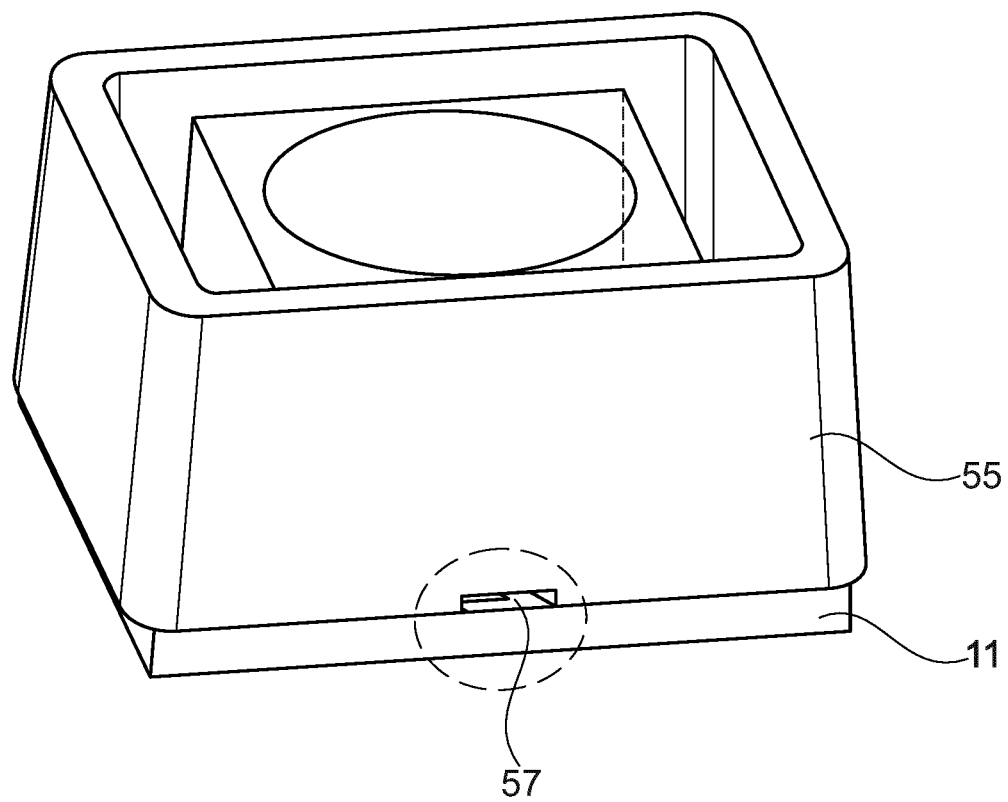

FIG. 3 shows schematically an exploded view of a second example of an optoelectronic device in accordance with the present invention, FIG. 4 shows schematically a further exploded view of a portion of the device of FIG. 3, FIG. 5 is a schematic cutaway drawing of a portion of the device of FIG. 5, and FIG. 6 shows schematically a perspective view of an optoelectronic device not covered by the present invention.

The optoelectronic device shown in the exploded view of FIG. 1 comprises a substrate 11 and an optoelectronic semiconductor component 13 which is preferably a VCSEL. The component 13 is arranged on the substrate 11 and has a light-emitting surface 15 on the upper side 17 of the optoelectronic semiconductor component 13. The component 13 is as indicted in FIG. 1 not directly placed with its bottom side on the substrate 11, but on an intermediate plate 19, which may serve as a cooling element and/or for providing electric contacts and the like.

A cover 21 is arranged on the substrate 11 for covering the optoelectronic semiconductor component 13. The cover 21 provides a cavity 23, which surrounds the optoelectronic semiconductor component 13 when the cover 21 is arranged on the substrate 11. The cover 21 has at least one channel 25 (two channels 25 are shown in FIG. 1) which extends along a first direction FD in the cover 21 from the outside OS to the cavity 23. As shown in FIG. 1, the first direction FD extends perpendicular to the substrate 11 and in particular to the top surface of the substrate 11.

The cover 21 comprises a layered structure consisting of multiple parallel layers 27, 29, 31, 33, 35 of a material, which is preferably ceramic.

As shown in FIG. 2, a layer—as for example any one of layers 27-35—is made in form of a frame-like structure and thus forms a frame 59 which surrounds, when seen in the circumferential direction CD, a central recess 37. The recess 37 can be made by cutting-out the respective part from a layer. The frame 59 may comprise four frame elements which form four sidewalls 39, 41, 43, 45 surrounding the recess 37. The sidewalls and thus the frame elements are preferably formed of a single piece. Adjacent sidewalls enclose an angle of 90°, so that the four sidewalls form a structure with a quadratic or rectangular cross section as can be seen in FIG. 2. The recesses 37 of the layers 27-35 form the cavity 23 of the cover 21 as indicated in FIG. 1.

The channel 25 passes through the layers 31, 33, 35 in the first direction FD which is perpendicular to the layers 31, 33, 35. The channel 25 does not pass through the two layers 27 and 29 at the bottom which are closest to the topside of the substrate 11. A small recess or cutout 47 is arranged in a sidewall of these two layers 27 and 29 below the mouth of the channel 25 so that the channel 25 can exit into the recess or cutout 47 and thus into the cavity 23.

As can be further seen in FIG. 1, the channel 25 exits to the outside OS at a location which is remote from the substrate 11 and in particular at the top layer 35 and thus at the topside of the cover 21. The channel 25 can therefore be regarded as a vertical chimney for venting the cavity 23, for example in case of a pressure increase due to a heating of the cavity's air during operation of the device.

As can also be seen in FIG. 1, the frame-like structure of the top layer 35 encircles an opening of the cavity 23 at the topside of the cover 21. The frame-like structure of the top layer 35 is adapted to receive an insert 49 in the opening for closing the cavity 23 at the topside of the cover 21.

The insert 49 comprises an optical element 51, which may be a lens or a window, and a holder 53 for the optical element 51. The holder 53 may be made out of a fluid material, such as a silicone liquid material, which is poured around the optical element 51 that is placed into the cavity 23 and then cured. Thus, the insert 49 may also only comprise the optical element 51 while the holder 53 is fabricated within the cavity 23 from a liquid material which is cured. Light emitted from the light-emitting surface 15 on the upper side 17 of the optoelectronic semiconductor component 13 can pass through this optical element 51 and thereby exit the device.

The second variant of an optoelectronic device as shown in FIGS. 3 to 5 is similar to the device of FIG. 1. The second variant comprises four channels 25 that extend along the first direction FD in some of the layers 31-35 of the cover 21 from the outside OS to the cavity 23 such that the first direction FD is perpendicular to the substrate 11. The device of FIGS. 3 to 5 therefore provides four vertical chimneys in form of the four channels 25 for venting the cavity 23 and allowing a flow of air from the cavity 23 to the outside OS and vice versa. The channels 25 are in the corners of the layers 31-35. Furthermore, the recesses 47 are also in the corners of the two bottom layers 27 and 29 as shown in FIGS. 4 and 5 and just below the mouths of the channels 25.

As shown in FIG. 3 the optical element 51 comprises a central lens 61 surrounded by a casing 63. The optical element 51 can in particular be a meta-lens made of a composite material. The holder 53 can be regarded as a meta-lens potting and made of or comprise a silicone-based adhesive. The substrate 11 can be an Aluminiumnitrid (AlN) single-layer ceramic. Preferably, the optical element 61 is a one-piece element, in particular a one-piece glass, with a micro lens 61 crafted or manufactured on top of its surface and preferably including the bottom part of the casing 63 as well.

The layered structure of the cover 21 and/or the substrate 11 is preferably made of ceramics and in particular of so called LTCC (Low Temp Co-Fire Ceramics) or HTCC (High Temperature Co-Fire Ceramics) or any other multilayer substrate to achieve a venting hole. They can be fused into one single package. In particular, the layers 27-35 are made of this material. This may also remove the need for an external or separate frame design to hold a lens or glass cover needed for laser products.

In the described examples, the first direction FD is perpendicular to the substrate 11. The angle between the first direction FD and the substrate 11 is therefore at least approximately at a value of 90°. However, also other angle values, such as 30° or 45°, can be realized in accordance with the present invention.

The device shown in FIG. 6 comprises a substrate 11, an optoelectronic semiconductor component (not shown) on the substrate 11 and a cover 55. The cover 55 may be designed as the cover 21 described above. However, the cover 55 does not have any vertical channel, but a venting hole 57 running in parallel to the substrate 11 and from a cavity in the cover's inside to the outside. The venting hole 57 may be formed by a recess at the bottom side of the cover 55 which abuts the substrate 11.

Due to the presence of the venting hole 57, it is usually avoided to carry out cutting processes on the substrate 11 as debris from the sawing process may get into the venting hole 57 and clog it up. In the devices as shown in FIGS. 1 to 5, the mouths of the channels 25 to the outside OS are distant from the substrate 11 and thus debris from a cutting process does not get into the channels 25. Preferably, a cutting process is carried out with the devices turned upside down so that the mouths of the channels 25 to the outside OS are facing downward. The mouths of the channels 25 may also be covered during any manufacturing process by a foil or the like.

The described design helps to improve the overall packaging process by reducing the need for single unit processing towards bulk processes. In particular, several devices can be produced on a single substrate which is then cut in single pieces.

LIST OF REFERENCE SIGNS 11 substrate
13 optoelectronic semiconductor component
15 light emitting surface
17 upper side of optoelectronic semiconductor component
19 plate
21 cover
23 cavity
25 channel
27 layer
29 layer
31 layer
33 layer
35 layer
37 recess
39 sidewall, frame element
41 sidewall, frame element
43 sidewall, frame element
45 sidewall, frame element
47 recess, cut-out
49 insert
51 optical element
53 holder, material (hardened liquid)
55 cover
57 venting hole
59 frame
61 lens
63 casing
FD first direction
OS outside
CD circumferential direction

The invention claimed is:
1. An optoelectronic device comprising:
a substrate;
an optoelectronic semiconductor component being arranged on the substrate and having a light-emitting surface; and
a cover being arranged on the substrate for covering the optoelectronic semiconductor component, the cover providing a cavity which surrounds the optoelectronic semiconductor component when the cover is arranged on the substrate,
the cover having at least one channel which extends along a first direction in the cover from an outside to the cavity,
the first direction being not parallel to the substrate,
wherein a topend of at least one sidewall of the cavity encircles an opening of the cavity at a topside of the cavity, and
wherein an insert is arranged in the opening closing the cavity, the insert comprising at least one optical element, in particular a lens or a window, through which light emitted by the optoelectronic semiconductor component leaves the device.
2. The optoelectronic device of claim 1,
wherein the channel exits to the outside at a location which is remote from the substrate and preferably at a topside of the cover.
3. The optoelectronic device of claim 1,
wherein the channel exits to the cavity at a location which is remote from the substrate.
4. The optoelectronic device of claim 3,
wherein the channel exits into a recess in an inner surface of the cover which communicates with the cavity.
5. The optoelectronic device of claim 1,
wherein the channel runs rectilinear through the cover.
6. The optoelectronic device of claim 1,
wherein the cover comprises at least one side wall surrounding the cavity in a circumferential direction, the circumferential direction being at least approximately parallel to the substrate.
7. The optoelectronic device of claim 6,
wherein the cover comprises four side walls arranged in a quadratic or rectangular form.
8. The optoelectronic device of claim 6,
wherein the channel extends in a side wall of the optoelectronic device and in particular in a corner between two abutting side walls of the optoelectronic device.
9. The optoelectronic device of claim 1, wherein the at least one sidewall being adapted to receive the insert in the opening for closing the cavity at a topside of the cover.
10. The optoelectronic device of claim 1,
wherein the cover comprises a layered structure consisting of multiple parallel layers of a material.
11. The optoelectronic device of claim 10,
wherein the channel passes through at least some of the layers, the first direction being not parallel to the layers.
12. The optoelectronic device of claim 10,
wherein the layered structure comprises at least one layer through which the channel does not pass.
13. The optoelectronic device of claim 10,
wherein the layered structure comprises at least one layer, which includes a recess in an inner surface of the layer where the layer surrounds a larger, central recess.
14. The optoelectronic device of claim 10,
wherein each layer comprises or consists of a frame surrounding a central recess.

* * * * *